United States Patent
Kanaya et al.

(10) Patent No.: US 10,526,519 B2
(45) Date of Patent: Jan. 7, 2020

(54) THERMALLY CONDUCTIVE SHEET, PRODUCTION METHOD FOR THERMALLY CONDUCTIVE SHEET, HEAT DISSIPATION MEMBER, AND SEMICONDUCTOR DEVICE

(71) Applicant: Dexerials Corporation, Shinagawa-ku, Tokyo (JP)

(72) Inventors: Hiroki Kanaya, Tokyo (JP); Yu Nomura, Tokyo (JP); Shunsuke Uchida, Tokyo (JP); Shinichi Uchida, Tokyo (JP); Keisuke Aramaki, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/072,334

(22) PCT Filed: Jan. 13, 2017

(86) PCT No.: PCT/JP2017/001122
§ 371 (c)(1),
(2) Date: Jul. 24, 2018

(87) PCT Pub. No.: WO2017/130755
PCT Pub. Date: Aug. 3, 2017

(65) Prior Publication Data
US 2019/0055443 A1 Feb. 21, 2019

(30) Foreign Application Priority Data
Jan. 26, 2016 (JP) .................................. 2016-012663

(51) Int. Cl.
*H01L 23/34* (2006.01)
*C09K 5/14* (2006.01)
(Continued)

(52) U.S. Cl.
CPC .................. *C09K 5/14* (2013.01); *C08J 5/18* (2013.01); *C08K 3/04* (2013.01); *C08K 3/22* (2013.01);
(Continued)

(58) Field of Classification Search
CPC ... H01L 23/373; H01L 23/3737; H01L 23/42; H01L 23/3675; H01L 23/3731;
(Continued)

(56) References Cited

U.S. PATENT DOCUMENTS 6,597,575 B1 * 7/2003 Matayabas, Jr. .... H01L 23/3737
165/185
7,439,475 B2 * 10/2008 Ohta ...................... H01L 23/373
219/552
(Continued)

FOREIGN PATENT DOCUMENTS

JP 2000150740 5/2000
JP 2001-315244 11/2001
(Continued)

OTHER PUBLICATIONS

Japanese Patent Office, First Office Action issued in corresponding Japanese application No. 2016-012663, dated Jul. 18, 2017.
(Continued)

*Primary Examiner* — Luan C Thai
(74) *Attorney, Agent, or Firm* — Carmody Torrance Sandak & Hennessey LLP (57) ABSTRACT

A thermal conducting sheet including: a binder resin; carbon fibers; and a thermal conducting filler other than the carbon fibers, wherein a mass ratio (carbon fibers/binder resin) of the carbon fibers to the binder resin is less than 1.30, wherein an amount of the thermal conducting filler is from 48% by volume through 70% by volume, and wherein the carbon fibers are oriented in a thickness direction of the thermal conducting sheet.

8 Claims, 1 Drawing Sheet

(51) Int. Cl.
| | |
|---|---|
| *C08K 3/04* | (2006.01) |
| *H01L 23/373* | (2006.01) |
| *C08J 5/18* | (2006.01) |
| *C08K 3/22* | (2006.01) |
| *C08K 3/28* | (2006.01) |
| *C08K 7/06* | (2006.01) |
| *H01L 23/367* | (2006.01) |
| *H01L 23/00* | (2006.01) |
| *H01L 23/42* | (2006.01) |

(52) U.S. Cl.
CPC .............. *C08K 3/28* (2013.01); *C08K 7/06* (2013.01); *H01L 23/3675* (2013.01); *H01L 23/373* (2013.01); *H01L 23/3731* (2013.01); *H01L 23/3737* (2013.01); *H01L 23/42* (2013.01); *H01L 24/27* (2013.01); *H01L 24/29* (2013.01); *C08J 2383/04* (2013.01); *C08K 2003/2227* (2013.01); *C08K 2003/282* (2013.01); *C08K 2201/001* (2013.01); *H01L 24/16* (2013.01); *H01L 24/32* (2013.01); *H01L 24/73* (2013.01); *H01L 24/83* (2013.01); *H01L 2224/16225* (2013.01); *H01L 2224/2711* (2013.01); *H01L 2224/27602* (2013.01); *H01L 2224/27848* (2013.01); *H01L 2224/29291* (2013.01); *H01L 2224/29386* (2013.01); *H01L 2224/29387* (2013.01); *H01L 2224/29393* (2013.01); *H01L 2224/32245* (2013.01); *H01L 2224/73253* (2013.01); *H01L 2224/83101* (2013.01); *H01L 2924/00014* (2013.01); *H01L 2924/16152* (2013.01); *H01L 2924/16724* (2013.01); *H01L 2924/16747* (2013.01)

(58) Field of Classification Search
CPC ......... H01L 24/27; H01L 24/29; H01L 24/32; C08K 3/04; C09K 5/14
USPC ........................................................ 257/712
See application file for complete search history.

(56) References Cited

U.S. PATENT DOCUMENTS

| | | | | |
|---|---|---|---|---|
| 8,749,979 | B2* | 6/2014 | Iwai | ............... H01L 23/373 361/705 |
| 8,808,607 | B2* | 8/2014 | Usui | ............... C08J 5/18 264/442 |
| 9,536,804 | B2 | 1/2017 | Aramaki et al. | |
| 2007/0284366 | A1 | 12/2007 | Ohta | |
| 2013/0136895 | A1 | 5/2013 | Usui et al. | |
| 2014/0346710 | A1 | 11/2014 | Usui et al. | |
| 2014/0349067 | A1 | 11/2014 | Usui et al. | |
| 2016/0104657 | A1 | 4/2016 | Aramaki et al. | |
| 2016/0150680 | A1 | 5/2016 | Aramaki et al. | |

FOREIGN PATENT DOCUMENTS

| | | |
|---|---|---|
| JP | 2002003717 | 1/2002 |
| JP | 2002088249 | 3/2002 |
| JP | 2005054094 | 3/2005 |
| JP | 2007326976 | 12/2007 |
| JP | 4791146 | 7/2011 |
| JP | 2012001638 | 1/2012 |
| JP | 2012023335 | 2/2012 |
| JP | 2012109313 | 6/2012 |
| JP | 5660324 | 12/2014 |
| JP | 2015029071 | 2/2015 |
| JP | 2015029075 | 2/2015 |
| JP | 2015029076 | 2/2015 |

OTHER PUBLICATIONS

Japanese Patent Office, Second Office Action issued in corresponding Japanese application No. 2016-012663, dated Sep. 19, 2017.
Japanese Patent Office, First Office Action issued in corresponding Japanese application No. 2017-199376, dated Feb. 20, 2018.
Japanese Patent Office, Second Office Action issued in corresponding Japanese application No. 2017-199376, dated Jun. 12, 2018.
Korean Patent Office, Korean Office Action issued in corresponding Korean application No. 10-2018-7009825, dated Aug. 16, 2019.
Korean Intellectual Property Office, Notification of Reason for Refusal issued in corresponding Korean application No. 10-2019-7030256, dated Nov. 12, 2019.

* cited by examiner

THERMALLY CONDUCTIVE SHEET, PRODUCTION METHOD FOR THERMALLY CONDUCTIVE SHEET, HEAT DISSIPATION MEMBER, AND SEMICONDUCTOR DEVICE

TECHNICAL FIELD

The present invention relates to a thermal conducting sheet disposed between a heat generator such as a semiconductor element and a heat dissipater such as a heat sink, a method for producing a thermal conducting sheet, and a heat dissipation member and a semiconductor device including the thermal conducting sheet.

BACKGROUND ART

Hitherto, various cooling measures have been employed in semiconductor elements mounted on various electrical appliances such as personal computers and other devices, because if heat generated as a result of driving is accumulated, driving of the semiconductor elements and peripheral devices may be adversely affected. As a method for cooling electronic parts such as semiconductor elements, there are known, for example, a method for mounting the device with a fan to cool the air in the device housing, and a method for mounting the semiconductor element to be cooled with a heat sink such as a heat dissipation fin and a heat dissipation plate.

When a heat sink is mounted on the aforementioned semiconductor element to perform cooling, a thermal conducting sheet is provided between the semiconductor element and the heat sink in order to efficiently dissipate heat in the semiconductor element. As this thermal conducting sheet, a sheet obtained by adding a filler such as a thermal conducting filler in a dispersed state in a silicone resin is widely used. As one example of the thermal conducting filler, carbon fibers are favorably employed (for example, see PTLs 1 to 4).

However, the thermal conducting sheet containing the carbon fibers is excellent in thermal conductivity, but has a problem that electrical conductivity easily becomes high.

Therefore, for the purpose of increasing an insulating property of the thermal conducting sheet, a thermal conducting sheet containing carbon fibers and an electrically insulating heat conductive filler in a specific ratio has been proposed (for example, see PTL 5).

However, this proposed technique has a problem that high thermal conductivity demanded in recent years cannot be obtained.

CITATION LIST

Patent Literature

PTL 1: Japanese Patent (JP-B) No. 5671266
PTL 2: Japanese Patent Application Laid-Open (JP-A) No. 2005-54094
PTL 3: JP-B No. 5660324
PTL 4: JP-B No. 4791146
PTL 5: JP-A No. 2002-003717

SUMMARY OF INVENTION

Technical Problem

The present invention aims to solve the various problems in the related art and achieve an object described below. That is, the present invention has an object to provide a thermal conducting sheet having a high thermal conductivity and an excellent insulating property at the same time, a method for producing the thermal conducting sheet, and a heat dissipation member and a semiconductor device using the thermal conducting sheet.

Solution to Problem

Means for solving the above problems are as follows. That is,
<1> A thermal conducting sheet, including:
a binder resin;
carbon fibers; and
a thermal conducting filler other than the carbon fibers,
wherein a mass ratio (carbon fibers/binder resin) of the carbon fibers to the binder resin is less than 1.30,
wherein an amount of the thermal conducting filler is from 48% by volume through 70% by volume, and
wherein the carbon fibers are oriented in a thickness direction of the thermal conducting sheet.
<2> The thermal conducting sheet according to <1>,
wherein compressibility of the thermal conducting sheet at a load of 0.5 kgf/cm$^2$ is 3% or more.
<3> The thermal conducting sheet according to <1> or <2>,
wherein the thermal conducting filler includes at least one selected from the group consisting of aluminum oxide, aluminum nitride, and zinc oxide.
<4> The thermal conducting sheet according to any one of <1> to <3>,
wherein the binder resin is a silicone resin.
<5> A method for producing the thermal conducting sheet according to any one of <1> to <4>, the method including:
obtaining a molded body of a thermal conducting resin composition containing the binder resin, the carbon fibers, and the thermal conducting filler by molding the thermal conducting resin composition into a predetermined shape and curing the thermal conducting resin composition; and
obtaining a molded body sheet by cutting the molded body so as to have a sheet shape.
<6> The method for producing the thermal conducting sheet according to <5>,
wherein the obtaining the molded body is obtaining the molded body including the carbon fibers oriented along an extrusion direction by extruding the thermal conducting resin composition into a hollow die using an extruder to mold the thermal conducting resin composition into a predetermined shape and further curing the thermal conducting resin composition, and
wherein the obtaining the molded body sheet is obtaining the molded body sheet having a sheet shape by cutting the molded body in a perpendicular direction to the extrusion direction.
<7> A heat dissipation member, including:
a heat spreader configured to dissipate heat generated by an electronic part; and
the thermal conducting sheet according to any one of <1> to <4> provided on the heat spreader and interposed between the heat spreader and the electronic part.
<8> A semiconductor device, including:
an electronic part;
a heat spreader configured to dissipate heat generated by the electronic part; and
the thermal conducting sheet according to any one of <1> to <4> provided on the heat spreader and interposed between the heat spreader and the electronic part.

<9> The semiconductor device according to <8>, further including:

a heat sink, wherein the thermal conducting sheet according to any one of <1> to <4> is interposed between the heat spreader and the heat sink.

Advantageous Effects of Invention

The present invention can solve the various problems in the related art, achieve the object described above, and provide a thermal conducting sheet having a high thermal conductivity and an excellent insulating property at the same time, a method for producing the thermal conducting sheet, and a heat dissipation member and a semiconductor device using the thermal conducting sheet.

DESCRIPTION OF EMBODIMENTS (Thermal Conducting Sheet)

A thermal conducting sheet of the present invention includes at least a binder resin, carbon fibers, and a thermal conducting filler, and further includes other components if necessary.

<Binder Resin>

The binder resin is not particularly limited and may be appropriately selected depending on the intended purpose. Examples of the binder resin include thermosetting polymers.

Examples of the thermosetting polymers include cross-linked rubbers, epoxy resins, polyimide resins, bismaleimide resins, benzocyclobutene resins, phenol resins, unsaturated polyester, diallyl phthalate resins, silicone resins, polyurethane, polyimide silicone, thermosetting polyphenylene ether, and thermosetting modified polyphenylene ether. These may be used alone or in combination thereof.

Examples of the cross-linked rubbers include natural rubbers, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. These may be used alone or in combination thereof.

Among these examples, the thermosetting polymer is particularly preferably a silicone resin, because of an excellent molding processability and an excellent weatherability and in terms of close adhesiveness and conformity with an electronic part.

The silicone resin is not particularly limited and may be appropriately selected depending on the intended purpose. It is preferable that the silicone resin contain a main agent formed of a liquid silicone gel, and a curing agent. Examples of such a silicone resin include addition-reactive silicone resins and thermally-vulcanizable millable silicone resins to be vulcanized with peroxides. Among these silicone resins, addition-reactive silicone resins are particularly preferable because the thermal conducting sheet needs to have close adhesiveness with a heat generating surface of an electronic part and with a heat sink surface.

As the addition-reactive silicone resin, a two-pack addition-reactive silicone resin containing vinyl group-containing polyorganosiloxane as a main agent and Si—H group-containing polyorganosiloxane as a curing agent is preferable.

The blending ratio between the main agent and the curing agent in the combination of the main agent of the liquid silicone gel and the curing agent is not particularly limited and may be appropriately selected depending on the intended purpose.

The amount of the binder resin is not particularly limited and may be appropriately selected depending on the intended purpose. The amount of the binder resin is preferably from 10% by volume through 50% by volume, more preferably from 15% by volume through 40% by volume, particularly preferably from 20% by volume through 40% by volume.

In the present specification, a numerical range presented using "through" means such a range that the numeral described before the "through" is included in the numerical range as the minimum value and the numeral described after the "through" is included in the numerical range as the maximum value.

<Carbon Fibers>

The carbon fibers are not particularly limited and may be appropriately selected depending on the intended purpose. Examples of the carbon fibers include pitch-based carbon fibers, PAN-based carbon fibers, carbon fibers formed of graphitized PBO fibers, and carbon fibers synthesized by, for example, an arc discharge method, a laser evaporation method, a CVD method (chemical vapor deposition method), and a CCVD method (catalytic chemical vapor deposition method). Among these carbon fibers, carbon fibers formed of graphitized PBO fibers and pitch-based carbon fibers are particularly preferable in terms of thermal conductivity.

Here, the carbon fibers are not carbon fibers coated with an insulating material and have conductivity.

The carbon fibers can be used in a state that a part or the whole of each carbon fiber is surface-treated, in order to have a high close adhesiveness with the coating film. Examples of the surface treatment include an oxidation treatment, a nitriding treatment, nitration, and sulfonation, or a treatment for attaching or bonding, for example, a metal, a metal compound, and an organic compound to a functional group introduced into the surface by these treatments or to the surface of the carbon fibers. Examples of the functional group include a hydroxyl group, a carboxyl group, a carbonyl group, a nitro group, and an amino group.

An average fiber length (average longer-axis length) of the carbon fibers is not particularly limited and may be appropriately selected depending on the intended purpose. The average fiber length of the carbon fibers is preferably from 50 µm through 250 µm, more preferably from 75 µm through 200 µm, particularly preferably from 90 µm through 170 µm.

An average fiber diameter (average shorter-axis length) of the carbon fibers is not particularly limited and may be appropriately selected depending on the intended purpose. The average fiber diameter of the carbon fibers is preferably from 4 µm through 20 µm and more preferably from 5 µm through 14 µm.

An aspect ratio (average longer-axis length/average shorter-axis length) of the carbon fibers is not particularly limited and may be appropriately selected depending on the intended purpose. The aspect ratio of the carbon fibers is preferably 8 or more, more preferably from 9 through 30. When the aspect ratio is less than 8, the thermal conductivity may be poor because the fiber length (longer-axis length) of the carbon fibers is short.

Here, the average longer-axis length and the average shorter-axis length of the carbon fibers can be measured with, for example, a microscope and a scanning electron microscope (SEM).

The amount of the carbon fibers is not particularly limited and may be appropriately selected depending on the intended purpose. The amount of the carbon fibers is preferably from 2% by volume through 40% by volume, more preferably from 3% by volume through 38% by volume, particularly preferably from 4% by volume through 30% by volume. When the amount is less than 2% by volume, it may be difficult to obtain a sufficiently low thermal resistance. When the amount is more than 40% by volume, formability of the thermal conducting sheet and orientation of the carbon fibers may be adversely affected.

A mass ratio (carbon fibers/binder resin) of the carbon fibers to the binder resin is less than 1.30, preferably 0.10 or more but less than 1.30, more preferably 0.30 or more but less than 1.30, still more preferably 0.50 or more but less than 1.30, particularly preferably 0.60 or more but 1.20 or less. The mass ratio is 1.30 or more, an insulating property of the thermal conducting sheet becomes insufficient.

Moreover, when the thermal conducting sheet does not contain the carbon fibers, thermal characteristics (particularly, thermal conductivity) of the thermal conducting sheet become insufficient.

Here, the thermal conducting sheet contains the carbon fibers. That is, it is obvious that a lower limit of the mass ratio (carbon fibers/binder resin) of the carbon fibers to the binder resin is not 0.00 (the mass ratio is more than 0.00).

<Thermal Conducting Filler>

The thermal conducting filler is not particularly limited and may be appropriately selected depending on the intended purpose so long as the thermal conducting filler is a thermal conducting filler other than the carbon fibers. Examples of the thermal conducting filler include inorganic fillers.

For example, a shape, a material, and an average particle diameter of the inorganic filler are not particularly limited and may be appropriately selected depending on the intended purpose. The shape of the inorganic filler is not particularly limited and may be appropriately selected depending on the intended purpose. Examples of the shape include a spherical shape, an ellipsoidal shape, a block shape, a grainy shape, a flat shape, and an acicular shape. Among these shapes, a spherical shape and an ellipsoidal shape are preferable in terms of fillability and a spherical shape is particularly preferable.

In the present specification, the inorganic filler is different from the carbon fibers.

Examples of the inorganic filler include aluminum nitride (AlN), silica, aluminum oxide (alumina), boron nitride, titania, glass, zinc oxide, silicon carbide, silicon, silicon oxide, aluminum oxide, and metal particles. These may be used alone or in combination. Among these inorganic fillers, aluminum oxide, boron nitride, aluminum nitride, zinc oxide, and silica are preferable, and in terms of thermal conductivity, aluminum oxide, aluminum nitride, and zinc oxide are particularly preferable.

The inorganic filler may be surface-treated. When the inorganic filler is treated with a coupling agent as the surface treatment, the inorganic filler is improved in dispersibility and the thermal conducting sheet has an improved flexibility.

An average particle diameter of the inorganic filler is not particularly limited and may be appropriately selected depending on the intended purpose.

When the inorganic filler is alumina, the average particle diameter thereof is preferably from 1 µm through 10 µm, more preferably from 1 µm through 5 µm, particularly preferably from 3 µm through 5 µm. When the average particle diameter of the alumina is less than 1 µm, the inorganic filler may have a high viscosity and may not mix well. When the average particle diameter of the alumina is more than 10 µm, the thermal conducting sheet may have a high thermal resistance.

When the inorganic filler is aluminum nitride, the average particle diameter thereof is preferably from 0.3 µm through 6.0 µm, more preferably from 0.3 µm through 2.0 µm, particularly preferably from 0.5 µm through 1.5 µm. When the average particle diameter of the aluminum nitride is less than 0.3 µm, the inorganic filler may have a high viscosity and may not mix well. When the average particle diameter of the aluminum nitride is more than 6.0 µm, the thermal conducting sheet may have a high thermal resistance.

The average particle diameter of the inorganic filler can be measured with, for example, a particle size distribution meter and a scanning electron microscope (SEM).

The amount of the thermal conducting filler is from 48% by volume through 70% by volume, preferably from 50% by volume through 69% by volume. When the amount of the thermal conducting filler is either less than 48% by volume or more than 70% by volume, both an insulating property and high thermal conductivity cannot be achieved. When the amount of the thermal conducting filler is either less than 48% by volume or more than 70% by volume, it is difficult to prepare the thermal conducting sheet.

<Other Components>

The other components are not particularly limited and may be appropriately selected depending on the intended purpose. Examples of the other components include a thixotropic nature imparting agent, a dispersant, a curing accelerator, a retarder, a slight adhesiveness imparting agent, a plasticizer, a flame retardant, an antioxidant, a stabilizer, and a colorant.

An average thickness of the thermal conducting sheet is not particularly limited and may be appropriately selected depending on the intended purpose. The average thickness of the thermal conducting sheet is preferably from 0.05 mm through 5.00 mm, more preferably from 0.07 mm through 4.00 mm, particularly preferably from 0.10 mm through 3.00 mm.

It is preferable that the surface of the thermal conducting sheet be coated with a bled-out component that has bled out from the thermal conducting sheet conformally to the bossed shapes of the carbon fibers that are protruding.

The method for obtaining this state of the surface of the thermal conducting sheet can be performed through, for example, a surface coating step which will be described hereinafter.

A volume resistivity of the thermal conducting sheet under application of voltage of 1,000 V is preferably $1.0 \times 10^8$ Ω·cm or more, more preferably $1.0 \times 10^{10}$ Ω·cm or more in order to prevent short circuit of an electric circuit around a semiconductor element to be used. The volume resistivity can be measured according to, for example, the JIS K-6911.

An upper limit of the volume resistivity is not particularly limited and may be appropriately selected depending on the intended purpose. For example, the volume resistivity is $1.0 \times 10^{18}$ Ω·cm or less.

The compressibility of the thermal conducting sheet at a load of 0.5 kgf/cm² is preferably 3% or more and more preferably 15% or more in terms of close adhesiveness with an electronic part and with a heat sink.

The upper limit of the compressibility of the thermal conducting sheet is not particularly limited and may be appropriately selected depending on the intended purpose. The compressibility of the thermal conducting sheet is preferably 30% or less.

In the thermal conducting sheet, the carbon fibers are oriented in a thickness direction of the thermal conducting sheet. By establishing that state in combination with defining the aforementioned specific mass ratio between the carbon fibers and the binder resin and the aforementioned specific amount of the thermal conducting filler, a thermal conducting sheet achieving both a high thermal conductivity and an excellent insulating property can be obtained.

Here, the expression "carbon fibers are oriented in a thickness direction of the thermal conducting sheet" means that 45% or more of the carbon fibers contained in the thermal conducting sheet is oriented within a range of from 0° through 45° with respect to a thickness direction. Note that, all the carbon fibers are not necessarily oriented in the same direction.

Orientation of the carbon fibers can be measured with, for example, an electron microscope.

(Method for Producing Thermal Conducting Sheet)

A method for producing the thermal conducting sheet of the present invention includes at least a molded body producing step and a molded body sheet producing step, preferably includes a surface coating step, and further includes other steps if necessary.

A method for producing the thermal conducting sheet is a method for producing the thermal conducting sheet of the present invention.

<Molded Body Producing Step>

The molded body producing step is not particularly limited and may be appropriately selected depending on the intended purpose, so long as the molded body producing step is a step of obtaining a molded body of a thermal conducting resin composition containing the binder resin, the carbon fibers, and the thermal conducting filler by molding the thermal conducting resin composition into a predetermined shape and curing the thermal conducting resin composition.

—Thermal Conducting Resin Composition—

The thermal conducting resin composition includes at least a binder resin, carbon fibers, and a thermal conducting filler and further includes other components if necessary.

Examples of the binder resin include the binder resin exemplified in the description of the thermal conducting sheet.

Examples of the carbon fibers include the carbon fibers exemplified in the description of the thermal conducting sheet.

Examples of the thermal conducting filler include the thermal conducting filler exemplified in the description of the thermal conducting sheet.

The method for molding the thermal conducting resin composition into a predetermined shape in the molded body producing step is not particularly limited and may be appropriately selected depending on the intended purpose. Examples of the method include an extrusion molding method and a die molding method.

The molded body producing step is preferably a step of obtaining the molded body including the carbon fibers oriented along an extrusion direction by extruding the thermal conducting resin composition into a hollow die using an extruder to mold the thermal conducting resin composition into a predetermined shape and further curing the thermal conducting resin composition, because the carbon fibers in the thermal conducting sheet obtained are easily oriented in a thickness direction of the thermal conducting sheet.

A size and a shape of the molded body (a block-shaped molded body) can be determined depending on the required size of the thermal conducting sheet. Examples of the size and shape include a rectangular parallelepiped having a cross-section in which the vertical size is from 0.5 cm through 15 cm and the horizontal size is from 0.5 cm through 15 cm. The length of the rectangular parallelepiped may be determined according to necessity.

Curing of the thermal conducting resin composition in the molded body producing step is preferably thermal curing. A curing temperature in the thermal curing is not particularly limited and may be appropriately selected depending on the intended purpose. The curing temperature is preferably from 60° C. through 120° C. when, for example, the binder resin contains a liquid silicone gel main agent and a curing agent. A curing time in the thermal curing is not particularly limited and may be appropriately selected depending on the intended purpose. The time is, for example, from 0.5 hours through 10 hours.

<Molded Body Sheet Producing Step>

The molded body sheet producing step is not particularly limited and may be appropriately selected depending on the intended purpose so long as the molded body sheet producing step is a step of cutting the molded body into a sheet shape to obtain a molded body sheet. For example, the molded body sheet producing step can be performed with a slicing device.

In the molded body sheet producing step, the molded body is cut into a sheet shape, to obtain a molded body sheet. The carbon fibers are protruding on the surface of the obtained molded body sheet. This is considered due to that in cutting of the molded body into a sheet shape with, for example, the slicing device, the cured component of the binder resin is drawn and elongated by the cutting member of, for example, the slicing device due to the hardness difference between the cured component of the binder resin and the carbon fibers, so the cured component of the binder resin is removed from the surface of the carbon fibers in the surface of the molded body sheet.

The slicing device is not particularly limited and may be appropriately selected depending on the intended purpose. Examples of the slicing device include an ultrasonic cutter and a plane. The cutting direction along which the molded body is cut is preferably from 60 degrees through 120 degrees, more preferably from 70 degrees through 100 degrees, particularly preferably 90 degrees (vertically) with respect to the extruding direction because there are components that are oriented in the extruding direction when the molding method is the extrusion molding method.

When the molded body producing step is a step of obtaining the molded body including the carbon fibers oriented along an extrusion direction by extruding the thermal conducting resin composition into a hollow die using an extruder to mold the thermal conducting resin composition into a predetermined shape and further curing the thermal conducting resin composition, the molded body sheet producing step is preferably a step of obtaining the molded body sheet having a sheet shape by cutting the molded body in a perpendicular direction to the extrusion direction An average thickness of the molded body sheet is not particularly limited and may be appropriately selected depending on the intended purpose. The average thickness of the molded body sheet is preferably from 0.06 mm through 5.01 mm, more preferably from 0.08 mm through 4.01 mm, particularly preferably from 0.11 mm through 3.01 mm.

<Surface Coating Step>

The surface coating step is not particularly limited and may be appropriately selected depending on the intended purpose so long as the surface coating step is a step of coating the surface of the molded body sheet with a bled-out component that bleeds out from the molded body sheet conformally to the bossed shapes of the carbon fibers that are protruding. Examples of the surface coating step include a press treatment and a treatment for leaving the molded body sheet standing.

Here, the "bled-out component" is a component that has been contained in the thermal conducting resin composition but has not contributed to the curing, and refers to, for example, a non-curable component and an uncured component of the binder resin.

—Press Treatment—

The press treatment is not particularly limited and may be appropriately selected depending on the intended purpose so long as the press treatment is a treatment for pressing the molded body sheet to coat the surface of the molded body sheet with a bled-out component that bleeds out from the molded body sheet conformally to the bossed shapes of the carbon fibers that are protruding.

The press can be performed with, for example, a pair of press devices formed of a platen and a press head having a flat surface. The press may also be performed with a pinch roll.

A press pressure is not particularly limited and may be appropriately selected depending on the intended purpose. The press pressure is preferably from 0.1 MPa through 100 MPa, more preferably from 0.5 MPa through 95 MPa. This is because there is a tendency that when the pressure is too low, thermal resistance results in the same level as when the press is not performed, and because there is a tendency that when the pressure is too high, the sheet is elongated.

The press time is not particularly limited and may be appropriately selected depending on, for example, the component of the binder resin, the press pressure, the area of the sheet, and the bleeding amount of the bled-out component.

In order to even more promote the effects of bleeding of the bled-out component and coating of the surface of the molded body sheet, the press treatment may be performed under heating using a press head including a built-in heater. In order to enhance these effects, the heating temperature is preferably higher than or equal to the glass transition temperature of the binder resin. This can shorten the press time.

In the press treatment, the molded body sheet is pressed in order to cause the bled-out component to bleed out from the molded body sheet and coat the surface with the bled-out component. Therefore, the thermal conducting sheet to be obtained can have a better conformity and a better close adhesiveness with the surface of an electronic part and of a heat spreader and can have a lower thermal resistance. When the coating with the bled-out component has a thickness of a level that reflects the shape of the carbon fibers on the surface of the thermal conducting sheet, thermal resistance rise can be avoided.

With the press, the molded body sheet is compressed in the thickness direction and can be increased in the frequency of mutual contacts of the carbon fibers and of the thermal conducting filler. This can reduce the thermal resistance of the thermal conducting sheet.

It is preferable to perform the press treatment with the use of a spacer for compressing the molded body sheet to have a predetermined thickness. That is, for example, by the molded body sheet being pressed with the spacer placed on a placing surface that faces the press head, the thermal conducting sheet can be formed to have a predetermined sheet thickness corresponding to the height of the spacer.

—Treatment for Leaving Molded Body Sheet Standing—

The treatment for leaving the molded body sheet standing is not particularly limited and may be appropriately selected depending on the intended purpose so long as it is a treatment for leaving the molded body sheet standing to let the surface of the molded body sheet be coated with the bled-out component that has bled out from the molded body sheet.

The treatment for coating the surface of the molded body sheet and the carbon fibers exposed on the surface of the molded body sheet with the bled-out component of the binder resin that has bled out from the molded body sheet may be the treatment for leaving the molded body sheet standing, instead of the press treatment. Also in this case, the thermal conducting sheet to be obtained can have a better conformity and a better close adhesiveness with the surface of an electronic part and of a heat spreader and can have a lower thermal resistance, as in the case of the press treatment. Further, when the coating with the bled-out component has a thickness of a level that reflects the shape of the carbon fibers on the surface of the thermal conducting sheet, thermal resistance rise can be avoided.

The standing time is not particularly limited and may be appropriately selected depending on the intended purpose.

Here, one example of a method for producing the thermal conducting sheet of the present invention will be described with reference to a figure.

Figure 1:
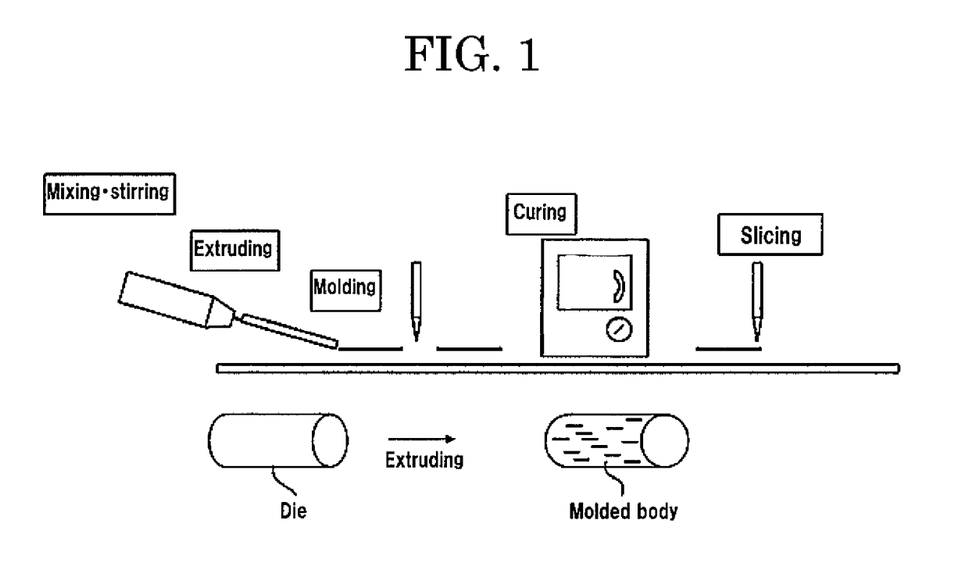
FIG. 1 is a schematic diagram illustrating one example of a flow of a method for producing a thermal conducting sheet of the present invention.

The thermal conducting sheet of the present invention is produced through a series of steps such as extruding, molding, curing, and cutting (slicing) as presented in FIG. 1.

First, a binder resin, carbon fibers, and a thermal conducting filler are mixed and stirred to prepare a thermal conducting resin composition. Next, when the prepared thermal conducting resin composition is extruded and molded, it is allowed to pass through a plurality of slits. This causes the carbon fibers contained in the thermal conducting resin composition to be oriented in an extrusion direction to thereby obtain a molded body. Next, after the molded body obtained is cured, a molded body sheet (thermal conducting sheet) can be prepared by cutting the cured molded body in a perpendicular direction to the extrusion direction using an ultrasonic cutter so as to have a predetermined thickness.

(Heat Dissipation Member)

A heat dissipation member of the present invention includes at least a heat spreader and a thermal conducting sheet, and further includes other members if necessary.

(Semiconductor Device)

A semiconductor device of the present invention includes at least an electronic part, a heat spreader, and a thermal conducting sheet, and further includes other members if necessary.

The electronic part is not particularly limited and may be appropriately selected depending on the intended purpose. Examples of the electronic part include a CPU, an MPU, and a graphic computing element.

The heat spreader is not particularly limited and may be appropriately selected depending on the intended purpose so long as the heat spreader is a member configured to dissipate heat generated by the electronic part.

The thermal conducting sheet is the thermal conducting sheet of the present invention, and is disposed on the heat spreader and interposed between the heat spreader and the electronic part.

An example of the semiconductor device of the present invention will be described with reference to the drawing.

Figure 2:
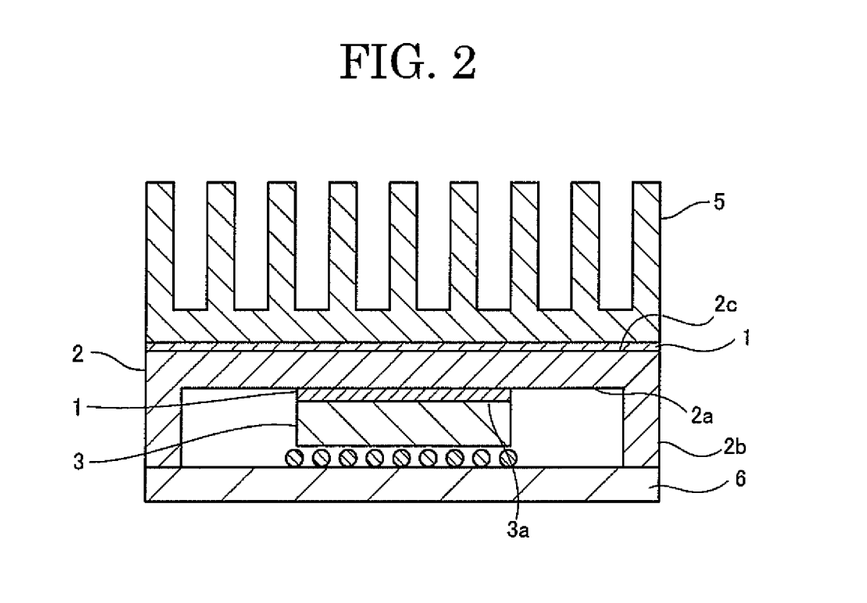
FIG. 2 is a cross-sectional view illustrating a thermal conducting sheet, a heat dissipation member, and a semiconductor device to which the present invention is applied.

FIG. 2 is a schematic cross-sectional view of an example of the semiconductor device of the present invention. A thermal conducting sheet 1 of the present invention is configured to dissipate heat generated by an electronic part 3 such as a semiconductor element. As illustrated in FIG. 2, the thermal conducting sheet 1 is fixed on a principal surface 2a of a heat spreader 2 facing the electronic part 3 and is interposed between the electronic part 3 and the heat spreader 2. The thermal conducting sheet 1 is also interposed between the heat spreader 2 and a heat sink 5. Together with the heat spreader 2, the thermal conducting sheet 1 constitutes a heat dissipation member configured to dissipate heat of the electronic part 3.

The heat spreader 2 is formed in, for example, a square plate shape, and includes the principal surface 2a facing the electronic part 3 and a side wall 2b formed upright along the circumference of the principal surface 2a. In the heat spreader 2, the thermal conducting sheet 1 is provided on the principal surface 2a surrounded by the side wall 2b, and the heat sink 5 is provided on the other surface 2c opposite to the principal surface 2a with the thermal conducting sheet 1 interposed between the heat sink and the other surface. The head spreader 2 may be formed of, for example, copper or aluminum having a good thermal conductivity, because a higher thermal conductivity ensures a lower thermal resistance and a more efficient absorption of heat from the electronic part 3 such as a semiconductor element.

The electronic part 3 is, for example, a semiconductor element such as BGA, and is mounted on a wiring board 6. The end surface of the side wall 2b of the heat spreader 2 is also mounted on the wiring board 6. In this way, the electronic part 3 is surrounded by the side wall 2b with a predetermined distance secured.

Then, with the thermal conducting sheet 1 bonded to the principal surface 2a of the heat spreader 2, a heat dissipation member configured to absorb heat generated by the electronic part 3 and dissipate the heat through the heat sink 5 is formed. The heat spreader 2 and the thermal conducting sheet 1 may be bonded to each other by the own adhesive force of the thermal conducting sheet 1, but an adhesive may be appropriately used. As the adhesive, known heat dissipating resins or heat dissipating adhesive films that serve bonding and thermal conduction of the thermal conducting sheet 1 to the heat spreader 2 may be used.

EXAMPLES

Next, Examples of the present invention will be described. In the present examples, a component ratio between the binder component and the curing agent component in the thermal conducting resin composition was changed to form a sample of the thermal conducting sheet. Then, various evaluations of each sample were performed.

Comparative Production Example 1

<Production of Insulating-Coated Carbon Fibers>
Pitch-based carbon fibers having an average fiber diameter of 9 μm and an average fiber length of 100 μm (product name: XN-100-10M, manufactured by Nippon Graphite Fiber Co., Ltd.) (100 g), tetraethoxysilane (TEOS) (200 g), and ethanol (900 g) were charged into a polyethylene container and mixed with a stirring blade.

While the resultant was warmed to 50° C., a reaction initiator (10% ammonia water) (176 g) was charged into the resultant for 5 minutes. The resultant was stirred for 3 hours from the time at which solvent charging was completed (0 minutes).

After stirring was completed, the resultant was subjected to temperature decrease and solids were collected by suction filtration. Then, the solids were washed with water and ethanol and were subjected to suction filtration again to collect solids.

The collected solids were dried at 100° C. for 2 hours and further fired at 200° C. for 8 hours, to obtain insulating-coated carbon fibers.

(Evaluation)

The insulating-coated carbon fibers obtained in Comparative Production Example 1 were evaluated in the manners described below. The following carbon fibers that were not insulating-coated were also evaluated for resistance. Evaluation results are presented in Table 2.

Sample 1:
Pitch-based carbon fibers having an average fiber diameter of 9 μm and an average fiber length of 100 μm (product name: XN-100-10M: manufactured by Nippon Graphite Fiber Co., Ltd.)

Sample 2:
Pitch-based carbon fibers having an average fiber diameter of 9 μm and an average fiber length of 120 μm (product name: XN-100-12M: manufactured by Nippon Graphite Fiber Corporation)

Sample 3:
Pitch-based carbon fibers having an average fiber diameter of 9 μm and an average fiber length of 150 μm (product name: XN-100-15M: manufactured by Nippon Graphite Fiber Corporation)

(1) Yield

The mass of each sample of the insulating-coated carbon fibers was measured. Then, the mass was divided by the mass of the carbon fibers used, to thereby calculate the yield. As the calculated yield was higher, it can be understood that the coating amount was higher.

(2) Film Thickness of Coating Film

Each sample of the insulating-coated carbon fibers was cut with a focused ion beam (FIB) and the cross-section was observed with a transmission electron microscope (TEM). Then, an average film thickness of the coating was measured.

(3) Resistance of Carbon Fibers

Each sample of the carbon fibers was charged into a cylindrical container (diameter: 9 mm, length: 15 mm) so that a filling density thereof was 0.750 g/cm$^3$. Then, the resistance was measured through the four-terminal method using a low resistance measuring device within ranges where application of voltage was 10 V at most.

At various voltages applied, the insulating-coated carbon fibers were measured for resistance through the two-terminal method using a high resistance measuring device. Measurable ranges of the high resistance measuring device are as follows.

TABLE 1

| | | Measurable range |
|---|---|---|
| Resistance ($\Omega$) | Measurement voltage 1 V | $1.0 \times 10^3$ or more but less than $1.0 \times 10^{11}$ |
| | Measurement voltage 10 V | $1.0 \times 10^3$ or more but less than $1.0 \times 10^{11}$ |
| | Measurement voltage 50 V | $1.0 \times 10^6$ or more but less than $1.0 \times 10^{12}$ |
| | Measurement voltage 100 V | $1.0 \times 10^6$ or more but less than $1.0 \times 10^{12}$ |
| | Measurement voltage 250 V | $1.0 \times 10^6$ or more but less than $1.0 \times 10^{12}$ |
| | Measurement voltage 500 V | $1.0 \times 10^7$ or more but less than $1.0 \times 10^{13}$ |
| | Measurement voltage 1000 V | $1.0 \times 10^8$ or more but less than $1.0 \times 10^{15}$ |

TABLE 2

| | | | Comparative Production Example 1 | Sample 1 | Sample 2 | Sample 3 |
|---|---|---|---|---|---|---|
| Formulation (g) | Carbon fibers | XN-100-10M | 100 | XN-100-10M | XN-100-12M | XN-100-15M |
| | Coating component | TEOS | 200 | | | |
| | | Aqueous 10% NH3 solution | 176 | | | |
| | Solvent | Ethanol | 900 | | | |
| Reaction conditions | | Temperature (° C.) | 50 | | | |
| | | Time (hr) | 3 | | | |
| Evaluation | | Yield | 107% | — | — | — |
| | | TEM film thickness (N = 2 Ave.) | 70 nm | — | — | — |
| | | Aggregation | None | None | None | None |
| Resistance $\Omega$ | | 10 V | 1.03E+10 | 3.98E−01 | 5.70E−02 | 1.56E−02 |
| | | 100 V | 7.31E+09 | — | — | — |
| | | 500 V | 1.65E+09 | — | — | — |
| | | 1000 V | 6.02E+08 | — | — | — |

In Table 2, "E" denotes "exponent of 10". That is, "1E+3" denotes "1000" and "1E−1" denotes "0.1". The applicable to Tables 4-1 to 4-3.

Example 1

Materials were mixed according to the following formulation to prepare a silicone resin composition (thermal conducting resin composition).
—Formulation—

| --Composition 1 (Total: 100% by volume)-- | |
|---|---|
| Carbon fibers (product name: XN-100-12M: manufactured by Nippon Graphite Fiber Corporation) | 7.99% by volume |
| Alumina (product name: DAW03, average particle diameter 4 μm, Denka Company Limited) | 37.83% by volume |
| Aluminum nitride (product name: JC, average particle diameter 1.2 μm, Toyo Aluminium K.K.) | 27.28% by volume |
| Silicone resin | 26.90% by volume |

Note that, the silicone resin is as follows.

| --Silicone resin-- | |
|---|---|
| Silicone resin A (product name: 527 (A), Dow Corning Toray Co., Ltd.) | 55% by mass |
| Silicone resin B (product name: 527 (B), Dow Corning Toray Co., Ltd.) | 45% by mass |

The silicone resin composition obtained was extruded into a rectangular parallelepiped die (42 mm×42 mm) the inside wall of which had been provided with a PET film subjected to a release treatment, to thereby mold a silicone molded body. The silicone molded body obtained was cured in an oven at 100° C. for 6 hours, to obtain a silicone cured product.

The silicone cured product obtained was heated for 1 hour at 100° C. in an oven and was cut in a perpendicular direction to an extrusion direction using an ultrasonic cutter to thereby obtain a molded body sheet having a thickness of 2.05 mm. A slicing speed of the ultrasonic cutter was 50 mm per second. An ultrasonic vibration applied to the ultrasonic cutter was 20.5 kHz as an oscillating frequency and 60 μm as an amplitude.

The obtained molded body sheet was sandwiched between PET films that had been subjected to a release treatment and was pressed with spacers having a thickness of 1.98 mm being inserted, to thereby obtain a thermal conducting sheet sample having a thickness of 2.00 mm. The press conditions were 50° C., 0.5 MPa, and 3 minutes. The filler found on the surface immediately after the slicing was not coated with the binder. By the press, the filler was pressed against the sheet and indented into the sheet, to cause the binder component to be exposed to the surface. Therefore, the filler was coated with the binder by reflecting the filler shape on the sheet surface. After the press, the binder component was found on the surface of the release-treatment PET that had contacted the sheet.

<Evaluation>

The following evaluations were performed. Results are presented in Table 4-1.

<<Presence or Absence of Orientation of Carbon Fibers>>

Whether the carbon fibers are oriented in a thickness direction of the thermal conducting sheet or not was confirmed by observing a cross section of the thermal conducting sheet obtained using a microscope (manufactured by HiROX Co Ltd, KH7700). Results are presented in Table 4-1.

When the carbon fibers were oriented in the thickness direction of the thermal conducting sheet, description of "presence of orientation" was presented in Table 4-1. Meanwhile, when the carbon fibers were not oriented in the thickness direction of the thermal conducting sheet, description of "absence of orientation" was presented in Table 4-1.

<<Thermal Characteristics (Effective Thermal Conductivity, Thermal Resistance, and Compressibility)>>

Measurement of thermal characteristics was performed using a thermal resistance measuring instrument (manufactured by Dexerials Corporation) compliant with ASTM-D5470.

Effective thermal conductivity was a thermal conductivity in a thickness direction.

Each characteristic was measured under a load of 0.5 kgf/cm$^2$.

<<Electric Characteristics (Volume Resistivity and Dielectric Breakdown Voltage)>>

—Volume Resistivity—

Volume resistivity with respect to applied voltage variation was measured with a resistance measuring instrument (manufactured by Mitsubishi Chemical Analytech Co., Ltd., HIRESTA-UX).

A sample having a considerably high resistance value that exceeded the measurement range (see Table 1) was indicated in Table 4-1, Table 4-2, and Table 4-3 as "Over Range" or "O.R.". A sample having a considerably low resistance value that fell below the measurement range (see Table 1) was indicated in Table 4-2 and Table 4-3 as "Under Range" or "U.R.".

Because the measurement range of volume resistivity was based on the measurement range of a resistance value, the unit of the measurement range in Table 1 was Ω.

—Dielectric Breakdown Voltage—

A dielectric breakdown voltage was measured with an ultrahigh-voltage breakdown voltage tester (manufactured by Keisoku Giken Co., Ltd., 7473) at a voltage increasing rate of 0.05 kV/second at room temperature. The voltage at which dielectric breakdown occurred was the dielectric breakdown voltage (kV/mm).

Examples 2 to 7 and Comparative Examples 1 to 9

A thermal conducting sheet was prepared in the same manner as in Example 1 except that each formulation of the compositions was changed as described in Table 3-1 or 3-2 and Table 4-1, 4-2, or 4-3.

However, a thermal conducting sheet of Comparative Example 7 was obtained in the same manner as in Example 3 except that when the molded product was prepared, the silicone resin composition was charged into a rectangular parallelepiped die (42 mm×42 mm) the inside wall of which had been provided with a PET film subjected to a release treatment without application of shear stress, and was molded with a lid to which the PET film had been pasted being placed thereon. As a result, the thermal conducting sheet containing the carbon fibers that are not oriented in the thickness direction was obtained.

The thermal conducting sheets obtained were evaluated in the same manner as in Example 1. Results are presented in Tables 4-1 to 4-3.

TABLE 3-1

| | | Example | | | | | | |
|---|---|---|---|---|---|---|---|---|
| Silicone resin | | 1 | 2 | 3 | 4 | 5 | 6 | 7 |
| 527 (A) | % by mass | 55 | 59 | 58 | 59 | 58 | 55 | 55 |
| 527 (B) | | 45 | 41 | 42 | 41 | 42 | 45 | 45 |

TABLE 3-2

| | | Comparative Example | | | | | | | | |
|---|---|---|---|---|---|---|---|---|---|---|
| Silicone resin | | 1 | 2 | 3 | 4 | 5 | 6 | 7 | 8 | 9 |
| 527 (A) | % by mass | 56 | 57 | 57 | 57 | 50 | 59 | 58 | 59 | 59 |
| 527 (B) | | 44 | 43 | 43 | 43 | 50 | 41 | 42 | 41 | 41 |

527 (A): Silicone resin, Dow Corning Toray Co., Ltd.
527 (B): Silicone resin, Dow Corning Toray Co., Ltd.

TABLE 4-1

| | | | Example | | | | |
|---|---|---|---|---|---|---|---|
| | | | 1 | 2 | 3 | 4 | 5 |
| Compounding ratio (% by volume) | Carbon fibers | XN-100-10M | | | 12.40 | | |
| | | XN-100-12M | 7.99 | 10.20 | | 12.48 | |
| | | XN-100-15M | | | | | 12.56 |
| | | Comparative Production Example 1 | | | | | |
| | Alumina | DAW03 | 37.83 | 37.09 | 55.37 | 54.44 | 54.79 |
| | Aluminum nitride | H1 | | | | | |
| | | JC | 27.28 | 25.68 | | | |
| | Silicone resin | | 26.90 | 27.03 | 32.23 | 33.08 | 32.65 |
| | Total (% by volume) | | 100.00 | 100.00 | 100.00 | 100.00 | 100.00 |
| | Amount of thermal conducting filler (% by volume) | | 65.12 | 62.76 | 55.37 | 54.44 | 54.79 |
| | Carbon fibers (C)-silicone resin (S) ratio | C/S (Mass ratio) | 0.68 | 0.86 | 0.88 | 0.86 | 0.88 |
| | Presence or absence of orientation of carbon fibers | | Presence of orientation | Presence of orientation | Presence of orientation | Presence of orientation | Presence of orientation |
| Heat characteristics | Effective thermal conductivity | [W/mK] | 11.92 | 13.97 | 9.23 | 10.19 | 14.14 |

TABLE 4-1-continued

|  |  |  | Example 1 | Example 2 | Example 3 | Example 4 | Example 5 |
|---|---|---|---|---|---|---|---|
|  | Thermal resistance | [° C · cm²/W] | 1.55 | 1.32 | 1.96 | 1.54 | 1.07 |
|  | Compressibility | [%] | 7.88 | 8.10 | 9.49 | 21.77 | 24.17 |
| Electric characteristics | Volume resistivity [(Ω · cm)] | 1 V | | | OverRange | | |
|  |  | 10 V | | | OverRange | | |
|  |  | 50 V | OverRange | | | | 9.01E+09 |
|  |  | 100 V | OverRange | | 1.90E+11 | 4.52E+09 | 2.16E+09 |
|  |  | 250 V | OverRange | | 4.49E+10 | 2.98E+09 | 6.18E+08 |
|  |  | 500 V | 8.56E+12 | 5.50E+11 | 4.46E+09 | 1.27E+09 | 4.37E+08 |
|  |  | 1000 V | 1.20E+11 | 1.05E+11 | 2.91E+08 | 3.66E+08 | 3.47E+08 |
|  | Dielectric breakdown voltage | [kV] | 1.73 | 1.43 | 1.10 | 1.51 | 0.71 |

TABLE 4-2

|  |  |  | Example 6 | Example 7 | Comparative Example 1 | Comparative Example 2 | Comparative Example 3 |
|---|---|---|---|---|---|---|---|
| Compounding ratio (% by volume) | Carbon fibers | XN-100-10M | | 7.14 | 22.34 | 23.07 | |
|  |  | XN-100-12M | 13.41 | | | | |
|  |  | XN-100-15M | | | | | 23.07 |
|  |  | Comparative Production Example 1 | | | | | |
|  | Alumina | DAW03 | 26.46 | 31.69 | 20.66 | 42.68 | 42.68 |
|  | Aluminum nitride | H1 | | | 23.84 | | |
|  |  | JC | 33.75 | 34.13 | | | |
|  | Silicone resin |  | 26.38 | 27.04 | 33.16 | 34.25 | 34.25 |
|  | Total (% by volume) |  | 100.00 | 100.00 | 100.00 | 100.00 | 100.00 |
|  | Amount of thermal conducting filler (% by volume) |  | 60.21 | 65.82 | 44.51 | 42.68 | 42.68 |
|  | Carbon fibers (C)-silicone resin (S) ratio | C/S (mass ratio) | 1.16 | 0.60 | 1.54 | 1.54 | 1.54 |
|  | Presence or absence of orientation of carbon fibers |  | Presence of orientation | Presence of orientation | Presence of orientation | Presence of orientation | Presence of orientation |
| Heat characteristics | Effective thermal conductivity | [W/mK] | 17.59 | 9.20 | 17.21 | 11.54 | 15.30 |
|  | Thermal resistance | [° C · cm²/W] | 1.04 | 1.95 | 0.85 | 1.17 | 0.83 |
|  | Compressibility | [%] | 8.65 | 10.30 | 27.14 | 32.47 | 36.38 |
| Electric characteristics | Volume resistivity [(Ω · cm)] | 1 V | OverRange | | 4.40E+04 | 2.51E+04 | 1.20E+03 |
|  |  | 10 V | OverRange | | | UnderRange | |
|  |  | 50 V | OverRange | | | UnderRange | |
|  |  | 100 V | 1.28E+10 | O.R. | | UnderRange | |
|  |  | 250 V | 1.03E+10 | O.R. | | UnderRange | |
|  |  | 500 V | 4.60E+09 | 5.46E+12 | | UnderRange | |
|  |  | 1000 V | 2.51E+09 | 3.80E+11 | | UnderRange | |
|  | Dielectric breakdown voltage | [kV] | 0.97 | 1.82 | 0.04 | 0.04 | 0.04 |

TABLE 4-3

|  |  |  | Comparative Example 4 | Comparative Example 5 | Comparative Example 6 | Comparative Example 7 | Comparative Example 8 | Comparative Example 9 |
|---|---|---|---|---|---|---|---|---|
| Compounding ratio (% by volume) | Carbon fibers | XN-100-10M | | 20.19 | | 12.40 | | |
|  |  | XN-100-12M | | | | | 14.39 | 7.85 |
|  |  | XN-100-15M | | | | | | |
|  |  | Comparative Production | | | 12.48 | | | |

TABLE 4-3-continued

|  |  |  | Comparative Example | | | | | |
|---|---|---|---|---|---|---|---|---|
|  |  |  | 4 | 5 | 6 | 7 | 8 | 9 |
|  | Alumina | Example 1 DAW03 |  | 6.23 | 54.44 | 55.37 | 47.46 | 71.34 |
|  | Aluminum nitride | H1 JC | 68.86 | 40.23 |  |  |  |  |
|  | Silicone resin |  | 31.14 | 33.35 | 33.08 | 32.23 | 38.15 | 20.81 |
|  | Total (% by volume) |  | 100.00 | 100.00 | 100.00 | 100.00 | 100.00 | 100.00 |
|  | Amount of thermal conducting filler (% by volume) |  | 68.86 | 48.31 | 54.44 | 55.37 | 47.46 | 71.34 |
|  | Carbon fibers (C)-silicone resin (S) ratio | C/S (mass ratio) | 0.00 | 1.39 | 0.86 | 0.88 | 0.86 | 0.86 |
|  | Presence or absence of orientation of carbon fibers |  | — | Presence of orientation | Presence of orientation | Absence of orientation | — | — |
| Thermal characteristics | Effective thermal conductivity | [W/mK] | 6.80 | 22.80 | 8.78 | 5.20 | — | — |
|  | Thermal resistance | [° C. · cm$^2$/W] | 2.91 | 0.78 | 1.82 | 3.38 | — | — |
|  | Compressibility | [%] | 1.06 | 10.80 | 20.26 | 12.08 | — | — |
| Electric characteristics | Volume resistivity [(Ω · cm)] | 1 V | O.R. | 1.80E+03 | OverRange | | — | — |
|  |  | 10 V | O.R. | U.R. | OverRange | | — | — |
|  |  | 50 V | O.R. | U.R. | OverRange | | — | — |
|  |  | 100 V | O.R. | U.R. | O.R. | 3.86E+09 | — | — |
|  |  | 250 V | O.R. | U.R. | O.R. | 1.72E+09 | — | — |
|  |  | 500 V | 9.21E+12 | U.R. | 8.37E+12 | 7.84E+08 | — | — |
|  |  | 1000 V | 1.12E+13 | U.R. | 4.29E+11 | 4.80E+08 | — | — |
|  | Dielectric breakdown voltage | [kV] | 10.2 | 0.04 | 1.61 | 1.28 | — | — |

H1: Aluminum nitride, average particle diameter 1 μm, Tokuyama Corporation

Here, specific gravities of the respective components are as follows.

Silicone resin: 0.97
Carbon fibers: 2.22
Alumina: 3.75
Aluminum nitride: 3.25

The thermal conducting sheets of Examples 1 to 7 had high thermal conductivity and were excellent in an insulating property.

Meanwhile, the thermal conducting sheets of Comparative Examples 1 to 3, and 5 were insufficient in an insulating property.

The thermal conducting sheet of Comparative Example 4 did not contain the carbon fibers, and thus had less thermal characteristics than the thermal conducting sheet of the present invention.

The thermal conducting sheet of Comparative Example 6 had the insulating-coated carbon fibers, and thus had less thermal characteristics than the thermal conducting sheet of the present invention.

The thermal conducting sheet of Comparative Example 7 had the carbon fibers that were not oriented in a thickness direction, and thus had less thermal characteristics than the thermal conducting sheet of the present invention.

In Comparative Example 8, the amount of the thermal conducting filler was less than 48% by volume. Therefore, a viscosity of the silicone resin composition (thermal conducting resin composition) was too low to prepare the thermal conducting sheet.

In Comparative Example 9, the amount of the thermal conducting filler was more than 70% by volume. Therefore, a viscosity of the silicone resin composition (thermal conducting resin composition) was too high to prepare the thermal conducting sheet.

REFERENCE SIGNS LIST

1: thermal conducting sheet
2: heat spreader
2a: principal surface
3: electronic part
3a: upper surface
5: heat sink
6: wiring board

The invention claimed is:

1. A thermal conducting sheet, comprising:
   a binder resin;
   carbon fibers having conductivity; and
   a thermal conducting filler other than the carbon fibers,
     wherein the binder resin is a silicone resin,
     wherein the thermal conducting filler includes at least one selected from the group consisting of aluminum oxide, aluminum nitride, and zinc oxide
     wherein a mass ratio (carbon fibers/binder resin) of the carbon fibers to the binder resin is 0.60 or more but less than 1.30,
     wherein an amount of the thermal conducting filler is from 48% by volume through 70% by volume, and
     wherein the carbon fibers are oriented in a thickness direction of the thermal conducting sheet.

2. The thermal conducting sheet according to claim 1, wherein compressibility of the thermal conducting sheet at a load of 0.5 kgf/cm$^2$ is 3% or more.

3. A method for producing the thermal conducting sheet according to claim 1, the method comprising:
   obtaining a molded body of a thermal conducting resin composition containing the binder resin, the carbon fibers, and the thermal conducting filler by molding the thermal conducting resin composition into a predetermined shape and curing the thermal conducting resin composition; and obtaining a molded body sheet by cutting the molded body so as to have a sheet shape.

4. The method for producing the thermal conducting sheet according to claim 3,
wherein the obtaining the molded body is obtaining the molded body including the carbon fibers oriented along an extrusion direction by extruding the thermal conducting resin composition into a hollow die using an extruder to mold the thermal conducting resin composition into a predetermined shape and further curing the thermal conducting resin composition, and
wherein the obtaining the molded body sheet is obtaining the molded body sheet having a sheet shape by cutting the molded body in a perpendicular direction to the extrusion direction.

5. A heat dissipation member, comprising:
a heat spreader configured to dissipate heat generated by an electronic part; and
the thermal conducting sheet according to claim 1 provided on the heat spreader and interposed between the heat spreader and the electronic part.

6. A semiconductor device, comprising:
an electronic part;
a heat spreader configured to dissipate heat generated by the electronic part; and
the thermal conducting sheet according to claim 1 provided on the heat spreader and interposed between the heat spreader and the electronic part.

7. The semiconductor device according to claim 6, further comprising:
a heat sink,
wherein a thermal conducting sheet is interposed between the heat spreader and the heat sink,
wherein the thermal conducting sheet comprises a binder resin, carbon fibers, and a thermal conducting filler other than the carbon fibers,
wherein a mass ratio (carbon fibers/binder resin) of the carbon fibers to the binder resin is 0.60 or more but less than 1.30,
wherein an amount of the thermal conducting filler is from 48% by volume through 70% by volume, and
wherein the carbon fibers are oriented in a thickness direction of the thermal conducting sheet.

8. The thermal conducting sheet according to claim 1, wherein a volume resistivity of the thermal conducting sheet under application of voltage of 1,000 V is $1.0 \times 10^8$ Ω·cm or more.

* * * * *